United States Patent [19]
Kim et al.

[11] Patent Number: 5,969,949
[45] Date of Patent: Oct. 19, 1999

[54] INTERFITTING HEAT SINK AND HEAT SPREADER SLUG

[75] Inventors: David K. J. Kim; Barry Marshall, both of San Jose; Ronald Barnes, Livermore, all of Calif.

[73] Assignee: Sun Microsystems, Inc., Mountain View, Calif.

[21] Appl. No.: 09/052,817

[22] Filed: Mar. 31, 1998

[51] Int. Cl.$^6$ ...................................................... H05K 7/20
[52] U.S. Cl. ...................... 361/704; 165/80.3; 165/185; 257/718; 257/707; 361/710
[58] Field of Search ................... 165/80.2, 80.3, 165/185; 174/16.3; 257/706–707, 712–713, 718–719, 720, 733; 361/704, 707, 710, 714, 717–718, 722

[56] References Cited

U.S. PATENT DOCUMENTS

| | | | |
|---|---|---|---|
| 3,836,825 | 9/1974 | Hall et al. | 361/718 |
| 4,004,195 | 1/1977 | Harayda et al. | 361/707 |
| 5,055,909 | 10/1991 | Robbyn | 357/81 |
| 5,594,623 | 1/1997 | Schwegler | 361/710 |
| 5,615,735 | 4/1997 | Yoshida et al. | 165/80.3 |
| 5,734,555 | 3/1998 | McMahon | 361/704 |
| 5,742,478 | 4/1998 | Wu | 361/704 |
| 5,856,911 | 1/1999 | Riley | 361/704 |

*Primary Examiner*—Gregory Thompson
*Attorney, Agent, or Firm*—Flehr Hohbach Test Albritton & Herbert LLP; Julian Caplan

[57] ABSTRACT

A heat transmitting slug is attached to a chip or other heat emitting electronic component by an adhesive. A heat sink is mounted on the slug by one or more screws or other fasteners, preferably with thermal grease between the bottom of the heat sink base and the top of the slug. The top of the slug is formed with a longitudinal tongue and the base of the heat sink with a mating groove. Preferably the base of the heat sink is offset upwardly above the groove to resist tendency to fracture under stress.

14 Claims, 3 Drawing Sheets

INTERFITTING HEAT SINK AND HEAT SPREADER SLUG

CROSS REFERENCE TO RELATED APPLICATION

Reference is made to application Ser. No. 09/052,872, filed Mar. 31, 1998, entitled Module of Enclosure for Electronic Cards

BACKGROUND OF THE INVENTION

1. Field of the Invention

This invention relates to a new and improved interfitfing heat sink and heat spreader slug for use with heat emitting electronic components.

2. Description of Related Art

The use of heat sinks on electronic components is well known in the art. In accordance with the present invention, however, a slug is interposed between the component and the base of the heat sink which makes it convenient to remove the heat sink to provide access to the electronic component for testing or replacement. Particularly where a considerable number of heat sinks are mounted in close proximity, providing access to the underlying components has heretofor been difficult.

SUMMARY OF THE INVENTION

In accordance with the invention a chip or other heat emitting component which may or may not have a ball grid array (BGA) connecting the chip to a printed circuit board, card or other substrate is cooled by a heat sink. Interposed between the base of the heat sink and the top of the component is a slug, the bottom of which is adhered to the top of the component by epoxy or other adhesive. The base of the heat sink is fastened to the slug by screws or other fasteners so that the heat sink may be removed to provide access to the component. Preferably the top surface of the slug is formed with a tongue and the underside of the base of the heat sink with a groove so that the components are properly aligned. It will be understood, of course, that the underside of the base may be provided with the tongue and the groove may be formed in the slug.

A principal feature of the present invention is that the structure is rugged and does not require any small geometry features. The interfitting of the heat sink and the slug makes it possible to access the chip for testing or removal merely by unscrewing the heat sink from the slug.

Particularly when there are arrays of components having ball grid arrays mounted adjacent to one another on a printed wiring board, the height of the packages above the printed wiring board is difficult to control and this is particularly true when the components have from time to time been reworked. Mounting gang-type heat sinks across several devices is a serious problem. The use of a slug provides ease in removal of the heat sink both for ball grid array and non-ball grid array devices when it is necessary to rework such devices.

The heat sink attachment may be used for any size, shape and mass of heat sinks.

Heretofore bending stresses on the BGA package had a tendency to induce internal shorts and openings within the BGA device. The use of the present invention eliminates such bending stresses.

Heretofore clips have been used to mount heat sinks on components which were attached to printed wiring boards by ball grid array devices. Such clips failed when exposed to mechanical shock. The present invention eliminates such failures.

Particularly when the dimensions of the slug are less than that of the base of the heat sink, air flow between the electronic component and the underside of the heat sink is improved.

The use of interfitting tongues and grooves on the base of the heat sink and the top of the slug ensures proper alignment of the two components.

BRIEF DESCRIPTION OF THE DRAWINGS

The accompanying drawings, which are incorporated in and form a part of this specification, illustrate embodiments of the invention and, together with the description serve to explain the principles of the invention.

DESCRIPTION OF THE PREFERRED EMBODIMENT

Figure 1:
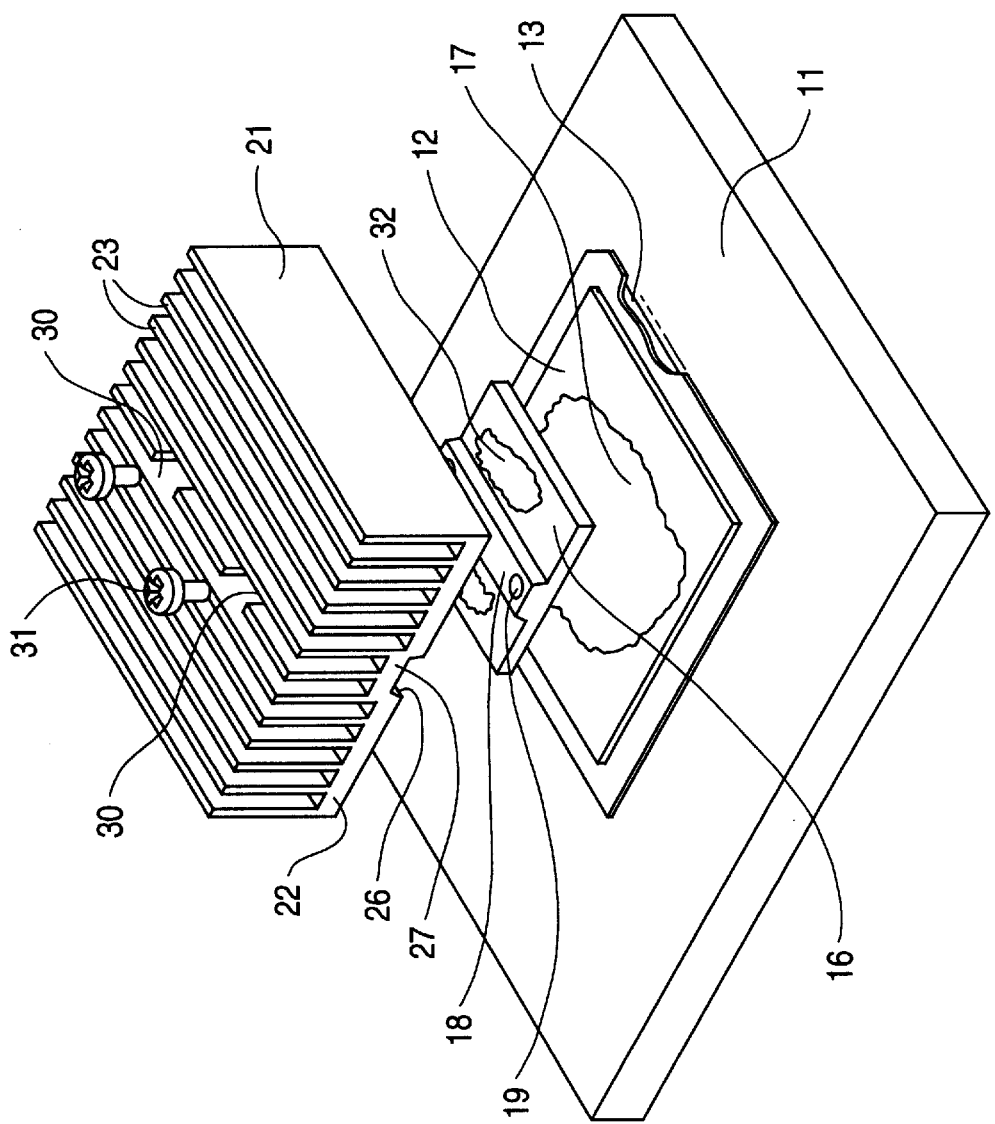
FIG. 1 is an exploded perspective view of the present invention.

Reference will now be made in detail to the preferred embodiment of the invention, examples of which are illustrated in the accompanying drawings. While the invention will be described in conjunction with the preferred embodiment, it will be understood that they are not intended to limit the invention to those embodiment. On the contrary, the invention is intended to cover alternatives, modifications and equivalents, which may be included within the spirit and scope of the invention as defined by the appended claims.

A PCB, graphics card or other substrate 11 is usually provided with a plurality of heat emitting chips 12 which may or may not be connected to the underlying substrate 11 by a ball grid array 13(BGA). It will be understood that many such chips 12 are conventionally mounted on a substrate 11 and that it is necessary to dissipate heat therefrom.

In accordance with the present invention a slug 16 which may be fabricated of such as aluminum, steel, copper or alloys is mounted on top of chip 12 by epoxy cement 17 or other suitable material in a permanent fashion. Preferably the upper surface of slug 16 is formed with a raised longitudinally extending tongue 18 and one or more tapped holes 19 may be formed in tongue 18.

Figure 3:
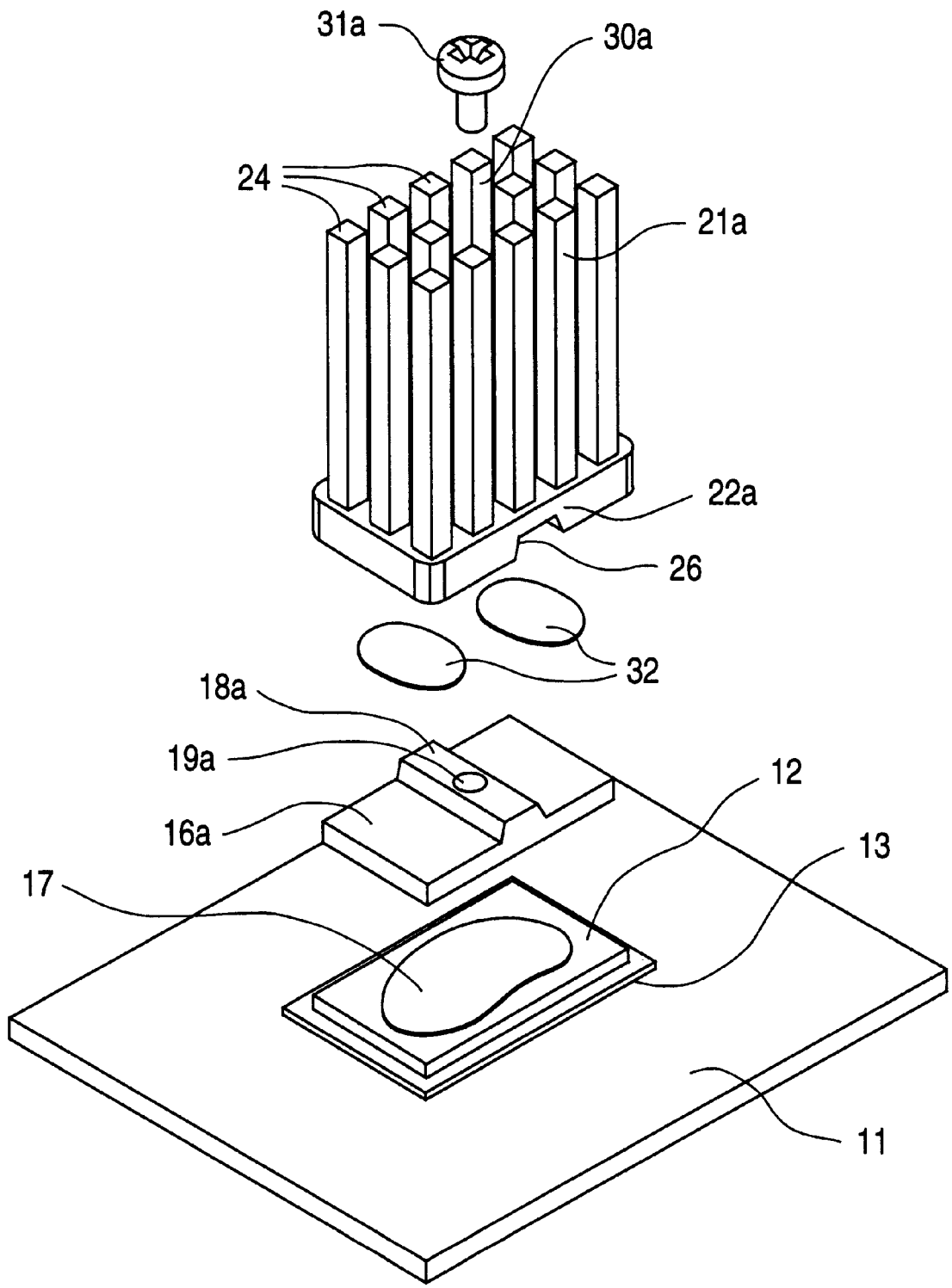
FIG. 3 is a view similar to FIG. 1 of a modified heat sink.

Heat sink 21 has a base 22 from which extend upwardly wafer-like fins 23 which dissipate heat to the adjacent atmosphere, as is well understood in the art. As shown in FIG. 3, the fins 23 may be replaced by plural pins 24. In accordance with the present invention the underside of base 22 is formed with a longitudinal groove 26 which mates with the tongue 18 to align the heat sink 21 with the slug 16 and the chip 12. To strengthen base 22, the base may be formed with an upward offset 27 above the groove 26. Holes 28 formed with counterbores 29 are formed in offset 27 in alignment with holes 19 and at least one of the fins above offset 27 is cut away as indicated by reference numerals 30 above holes 28. In the modification of FIG. 3 one or more pins 24 may be eliminated to provide cut away 30a. Screws 31 fitting through holes 28 and mating with tapped holes 19 detachably secure heat sink 21 to slug 16. Preferably thermal grease 32 is interposed between slug 16 and the underside of base 22 to improve thermal conductivity from the slug to the base. One suitable thermal grease is TECHSPRAY (silicon free heatsink compound produced by Techspray, Inc.).

It will be understood that instead of the tongue 18 being located on the slug 16 and the groove 26 being located on base 22, the relationship may be reversed. Further, instead of screw fasteners 31 being employed, other types of removable fasteners may be used. The number and positioning of the screws 31 is subject to considerable variation.

Figure 2:
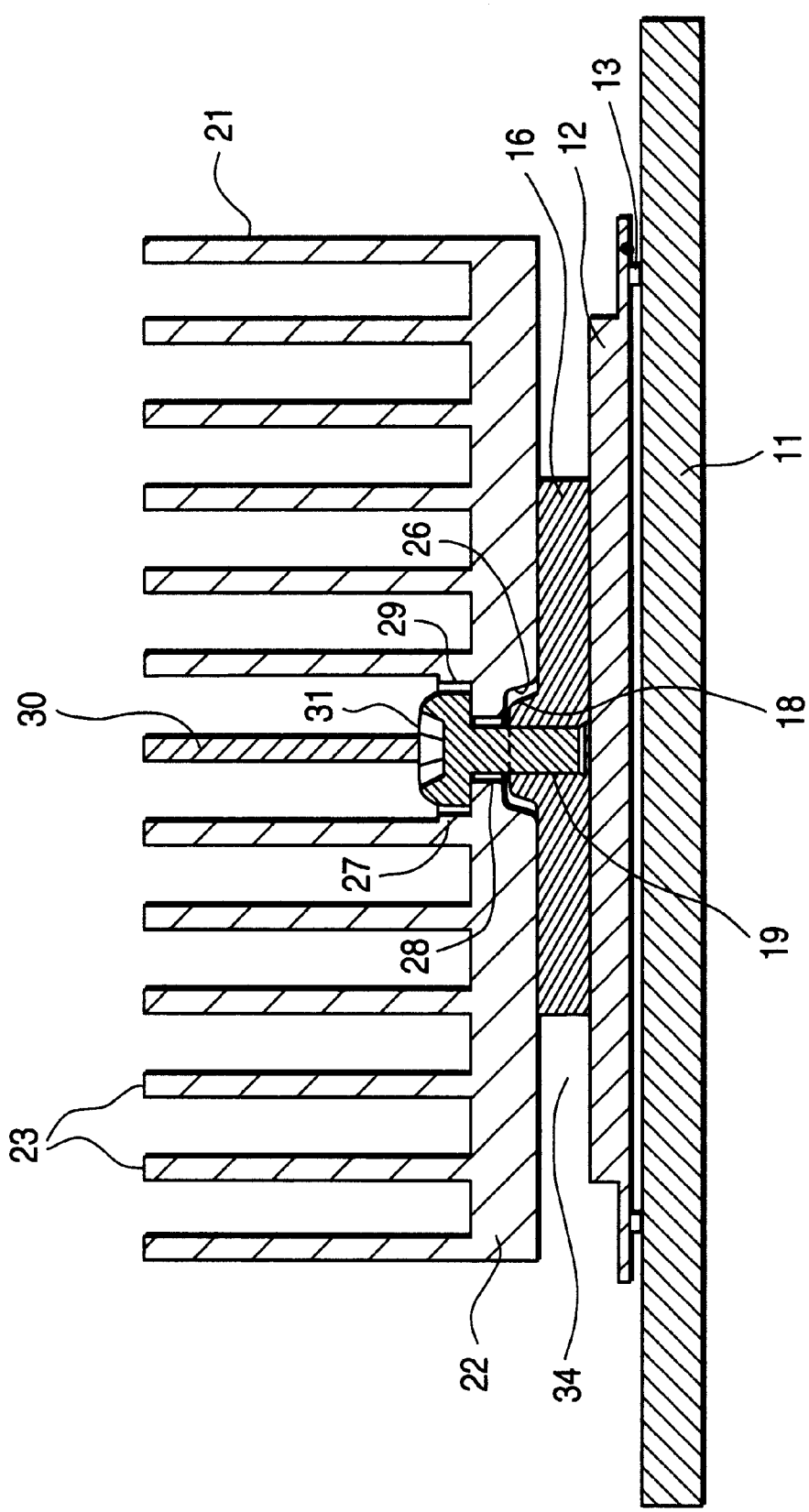
FIG. 2 is a vertical sectional view of the parts assembled.

As best shown in FIG. 2, the dimensions of slug 16 may be less than those of base 22. This provides for an air gap 34 which facilitates air circulation to cool component 12.

With regard to FIG. 3, many of the components of the structure shown therein resemble those of the preceding modification and the same reference numerals followed by subscript A designate corresponding parts.

The foregoing descriptions of a specific embodiment of the present invention have been presented for purposes of illustration and description. They are not intended to be exhaustive or to limit the invention to the precise forms disclosed, and obviously many modifications and variations are possible in light of the above teaching. The embodiment was chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. In combination, a heat slug having a top and bottom, said top and bottom being parallel and substantially flat, and a heat sink, said heat sink having a substantially flat base in thermal contact with said top of said slug, and a heat-emitting electronic component in thermal contact with said bottom of said slug, said slug being formed with a tapped hole and said base being formed with an aperture and a screw through said aperture threaded into said hole to detachably connect said heat sink to said heat slug.

2. The combination of claim 1 in which said top of said slug is formed with a protuberance and said bottom of said heat sink is formed with a socket receiving said protuberance to align said heat sink relative to said slug and to prevent relative rotation of said heat sink and said slug.

3. The combination of claim 2 in which said protuberance is a longitudinally extending tongue and said socket is a longitudinally extending groove.

4. The combination of claim 3 in which said base is formed with an upward offset above said groove.

5. The combination of claim 1 in which said heat sink is formed with a plurality of heat dissipating fins above said base.

6. The combination of claim 5 in which one said fin is cut away above said aperture.

7. The combination of claim 5 in which said fins are thin longitudinally extending wafers.

8. The combination of claim 5 in which said fins are vertical pins.

9. The combination of claim 1 which further comprises thermal grease between said heat sink and said slug.

10. The combination of claim 1 which further comprises means fixing said slug to said component.

11. The combination of claim 1 which further comprises adhesive fixing said slug to said component.

12. The combination of claim 1 which further comprises a wired substrate, said component being fixed to said substrate.

13. The combination of claim 12 which further comprises a ball grid array mechanically and electrically connecting said component to said substrate.

14. The combination of claim 1 in which said base has fins projecting from said base, said slug having a top substantially smaller than said base with an air gap around the perimeter of said slug under said heat sink and over said component.

* * * * *